United States Patent

Barrett et al.

[11] Patent Number: 5,937,317
[45] Date of Patent: *Aug. 10, 1999

[54] METHOD OF MAKING A LOW RESISTIVITY SILICON CARBIDE BOULE

[75] Inventors: Donovan L. Barrett, Port Orange, Fla.; Richard H. Hopkins, Export, Pa.; James P. McHugh, Pittsburgh, Pa.; Hudson McDonald Hobgood, Murrysville, Pa.

[73] Assignee: Northrop Grumman Corporation, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,972

[22] Filed: May 8, 1997

[51] Int. Cl.$^6$ .................................................. H01L 21/20
[52] U.S. Cl. .............................. 438/493; 438/931; 117/98
[58] Field of Search ..................................... 438/493, 931, 438/758; 117/84, 98

[56] References Cited

U.S. PATENT DOCUMENTS

| 4,866,005 | 9/1989 | Davis et al. | 117/98 |
| 5,433,167 | 7/1995 | Furukawa et al. | 117/84 |

OTHER PUBLICATIONS

Lilov et al., "Investigation of nitrogen solubility process in silicon carbide," Kristall un Tecknik, vol. 14, No. 1, pp. 111–116 (no month given), 1979.

Barrett et al., "SiC boule growth by sublimation vapor transport", Journal of Crystal Growth, vol. 109, pp. 17–23 (no month given), 1991.

Barrett et al., "Growth of large SiC single crystals", Journal of Crystal Growth, vol. 128, pp. 358–362 (no month given), 1993.

Tsvetkov et al., "Recent progress in SiC crystal growth", Inst. Phys. Conf. Ser. No. 142, Chapter 1, pp. 17–22 (no month given), 1995.

*Primary Examiner*—Charles Bowers
*Assistant Examiner*—Keith Christianson
*Attorney, Agent, or Firm*—Walter G. Sutcliff

[57] ABSTRACT

A nitrogen doped single crystal silicon carbide boule is grown by the physical vapor transport process by introducing nitrogen gas into the growth furnace. During the growth process the pressure within the furnace is maintained at a constant value, $P_o$, where $P_o \leq 100$ Torr. This is accomplished by measuring the pressure within the furnace and providing the pressure measurement to a process controller which regulates the nitrogen introduction as nitrogen gas is incorporated into the crystal structure. The partial pressure of the nitrogen may be selected to be at a value between 1 and $P_o$. If the desired partial pressure is less than $P_o$, an inert gas is added to make up the difference.

7 Claims, 3 Drawing Sheets

METHOD OF MAKING A LOW RESISTIVITY SILICON CARBIDE BOULE

BACKGROUND OF THE INVENTION

1. Field of the Invention

The invention in general relates to crystal growth and more particularly to the preparation of single crystal silicon carbide boules having very low resistivity, from which semiconductor substrates may be fabricated.

2. Description of Related Art

Silicon carbide is being extensively explored as a semiconductor material for various electronic applications. Semiconductor devices of silicon carbide have the ability to operate at higher voltages and temperatures than conventional silicon or gallium arsenide devices thus providing for higher power devices with reduced cooling requirements. Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

Silicon carbide crystals may be grown in a variety of ways, one of which utilizes a seed crystal of silicon carbide positioned within a furnace which also includes a source of pure silicon carbide. The furnace is heated to a temperature whereby the silicon carbide sublimates and is deposited upon the seed crystal. In one process, known as physical vapor transport, the seed crystal is positioned within a container having a growth cavity for the crystal. As silicon carbide is deposited from the source, a silicon carbide crystal, called a boule, is grown within the container. The physical vapor transport process is described in articles by D. L. Barrett et. al. in *Journal of Crystal Growth* Vol. 109 (1991) pp. 17–23, and Vol. 128 (1993) pp. 358–362, both of which are hereby incorporated by reference.

The grown boule is sliced into wafers for use as semiconductor device substrates. Many of these devices are vertically conducting devices, such as VMOS power switches and static induction transistors which require highly conductive substrates to minimize ohmic losses and to provide efficient performance. The method of the present invention results in an extremely low resistivity silicon carbide crystal which may be advantageously used as a substrate in silicon carbide semiconductor devices.

SUMMARY OF THE INVENTION

A method of making a low resistivity silicon carbide single crystal boule in accordance with the present invention includes the steps of placing a silicon carbide seed crystal in the growth furnace of a physical vapor transport system. Disposed within the furnace and spaced at a predetermined distance from the seed crystal is a source of silicon carbide feedstock.

Nitrogen gas is introduced into the furnace and the total pressure within the furnace is maintained at a substantially constant value between approximately 1 and 100 Torr during crystal growth. The nitrogen content may be mixed with an inert gas such as argon, in which case each gas contributes a certain partial pressure to the total pressure. The pressure within the furnace is constantly monitored and nitrogen gas is added so as to maintain the desired pressure as the nitrogen gas is incorporated into the boule growth. The partial pressure of the nitrogen is maintained at a predetermined value equal to a percentage of the total pressure. This predetermined value may be any desired value up to 100 percent of the total pressure, in which case the total pressure would be due solely to the nitrogen.

DESCRIPTION OF THE PREFERRED EMBODIMENT

Figure 1:
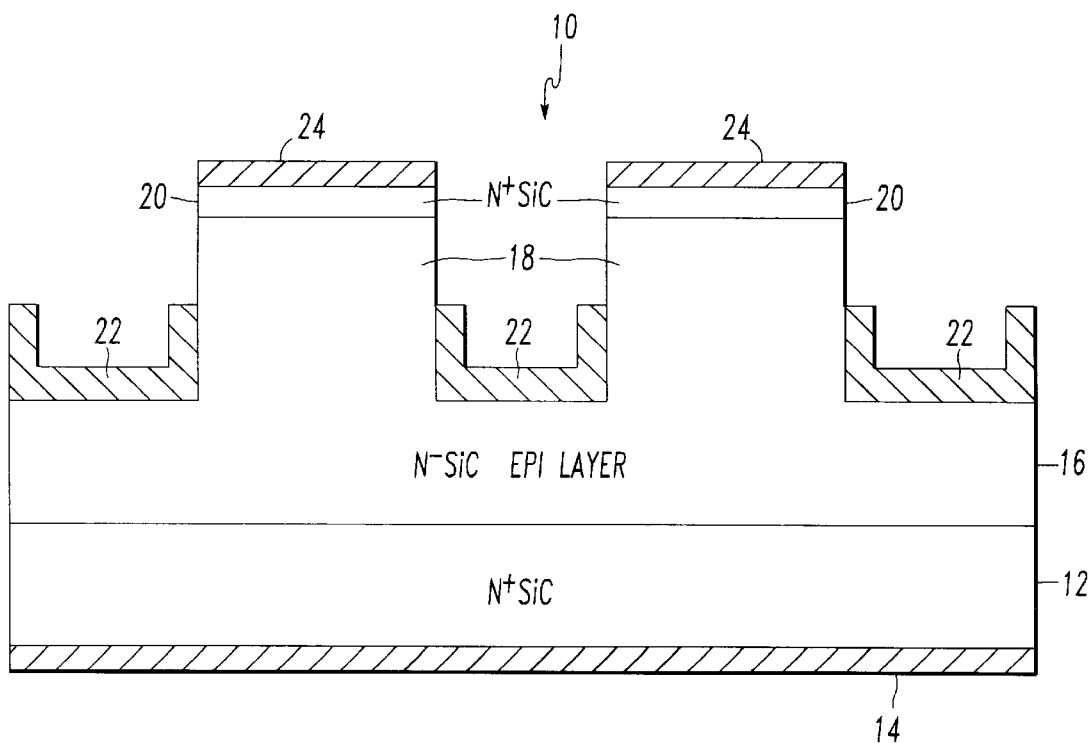
FIG. 1 is a cross sectional view of a transistor having a low resistivity silicon carbide substrate.

FIG. 1 illustrates a sectional view of one type of vertical power transistor. The transistor 10 includes a relatively thick silicon carbide substrate 12 to which is connected the drain electrode 14 of the transistor. The substrate is highly doped with nitrogen atoms to form a low resistivity, high conductivity $N^+$ SiC base upon which a relatively thin $N^-$ SiC epitaxial layer 16 may be deposited. The substrate 12 is shown broken away for scale purposes since it may be tens of thousands of times thicker than the overlying epitaxial layer 16.

Epitaxial layer 16 is formed with finger portions 18 each of which has an epitaxial $N^+$ SiC layer 20 thereon. Additional electrodes for the transistor 10 include gate electrodes 22 in the channels between the finger portions 18, and source electrodes 24 connected to respective layers 20.

For efficient operation it is essential to minimize ohmic losses in the silicon carbide substrate 12 so as to maximize current flow through the device. It is well known that to achieve high conductivity, an electrically active donor impurity such as nitrogen be added such that the nitrogen atom is incorporated into the silicon carbide lattice. It is not enough however to merely combine nitrogen with a growing silicon carbide boule; the process must be accomplished without destroying the crystal structure. The present invention accomplishes this objective and to this end reference is made to FIG. 2.

Figure 2:
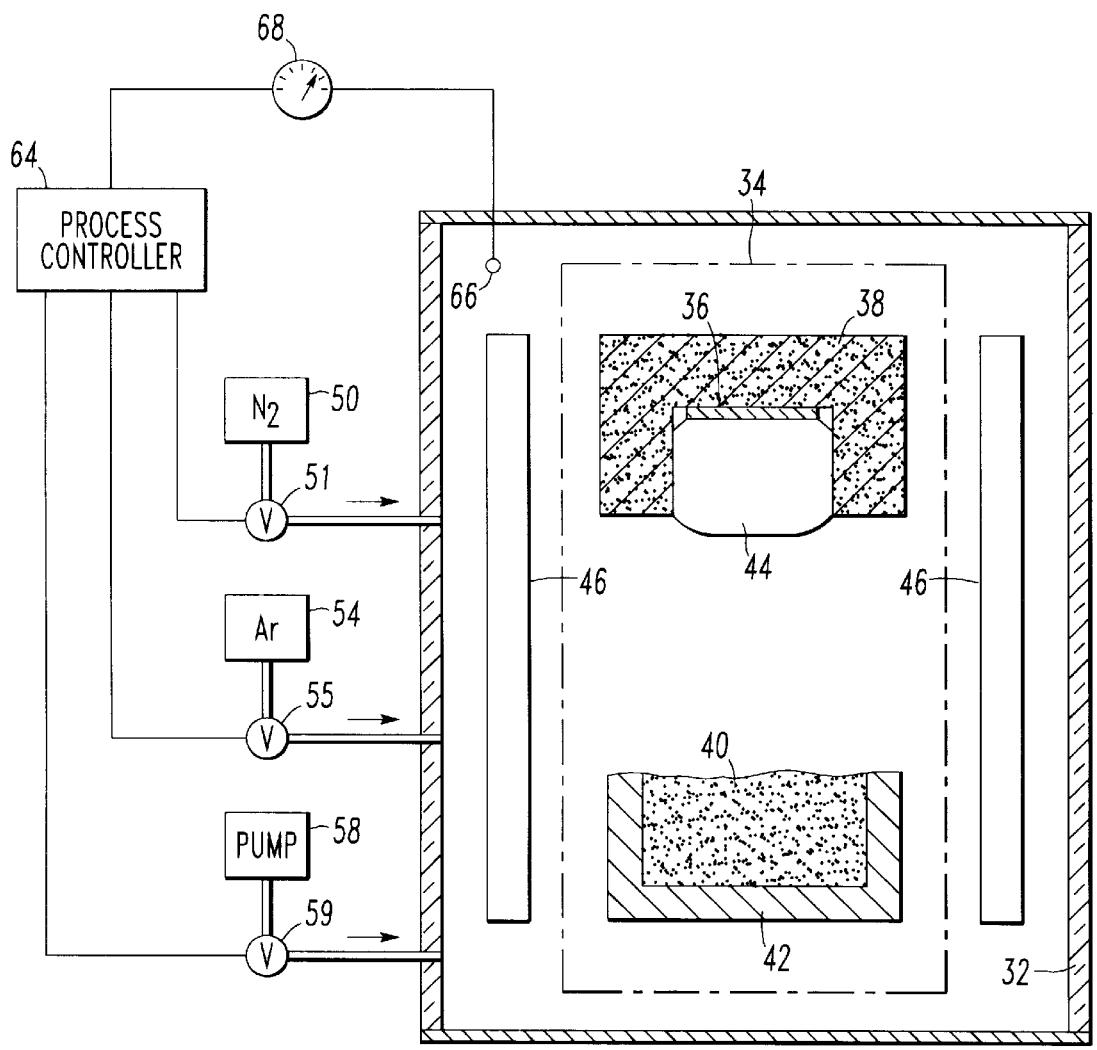
FIG. 2 illustrates apparatus for practicing the present invention.

FIG. 2 shows, in rudimentary form, typical apparatus for growing silicon carbide boules by the aforementioned physical vapor transport method. The apparatus includes a furnace system 30 having a vacuum tight outer wall or cylinder 32, inside of which is a growth containment arrangement 34. A silicon carbide seed crystal 36 within seed container 38 is disposed at a certain distance from silicon carbide feedstock 40 within source container 42. The required temperature for growth of the silicon carbide boule 44 is provided by a heating system 46, which may be inside or outside of the cylinder 32.

In accordance with the present invention a source of nitrogen, 50 is provided for introducing nitrogen gas into the interior of furnace system 30, as governed by control valve 51. In a similar fashion, an inert gas such as argon, from source 54, may be provided to the furnace system 30 as governed by control valve 55. Near vacuum conditions may be established within the furnace system 30 by means of a vacuum or exhaust pump 58 and a control valve 59.

Operation of the valves 51, 55 and 59 is governed by a process controller 64 which is provided with an indication of the pressure within the furnace system 30 by means of a pressure sensor 66. If desired, a pressure gage 68 may be added to provide a visual indication of the measured pressure.

To grow a low resistivity silicon carbide boule 44, the silicon carbide seed crystal 36 and silicon carbide feedstock 40 are placed in position and a vacuum is drawn by means of pump 58 to a pressure of, for example, $10^{-7}$ Torr (1 Torr is approximately equal to $\frac{1}{760}$ atmosphere). The heater system 46 is then activated to drive off any adsorbed gases in order to reduce any electrically active impurities. Valves 51 and 55 are opened by process controller 64 to introduce nitrogen and argon to pressurize the interior of the furnace system 30 to a value higher than the final selected operating pressure. This initial pressurization may be, for example, 500 to 600 Torr or greater.

Growth temperature is then established, for example 2200° C., at the seed crystal 36, and the operating pressure is selected to be any desired value between 1 and 100 Torr.

The total operating pressure $P_o$ is composed of the partial pressure of nitrogen and the partial pressure of argon (the partial pressures of the gasses from the feedstock 38 associated with crystal growth are assumed to be negligible). Therefore when nitrogen and argon are initially introduced into the system at the elevated pressure of 500 to 600 Torr, they are provided in the same proportions as the desired partial pressures so that when the gas mixture is exhausted to bring the pressure down to operating $P_o$, the proper partial pressure of the nitrogen will already be established. The greater the partial pressure of nitrogen the greater will be the nitrogen content of the silicon carbide crystal. In this regard, the partial pressure of nitrogen may, under certain conditions, be selected to be equal to the total pressure $P_o$, in which case no argon is utilized.

As the nitrogen is consumed by incorporation into the growing silicon carbide crystal the process controller 64 will, by control of valve 51, cause the addition of nitrogen from source 50 to maintain the partial pressure of nitrogen constant at a desired value between 1 and 100 percent, for example 40–60%. When the growth process is completed, the grown boule 44 may be removed for semiconductor wafer preparation.

Figure 3:
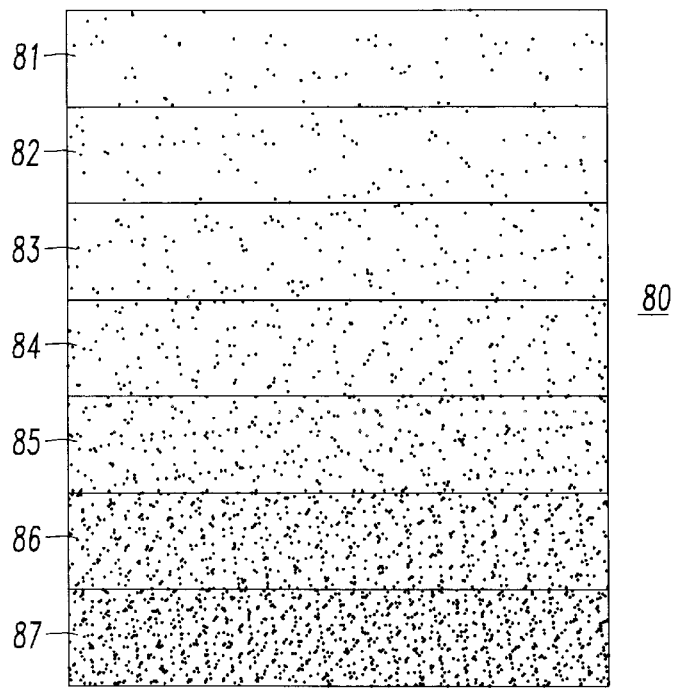
FIG. 3 is a view of a boule grown according to the process described herein and used for testing purposes.

FIG. 3 represents a nitrogen doped 4-H silicon carbide boule which was grown by the above described process, on the carbon side, <0001>, of a silicon carbide seed crystal. The boule 80 is divided into a plurality of sections, 81 to 87, sequentially grown with increasing concentrations of nitrogen, as indicated by the progressively darker stippling. After removal from the growth furnace and trimming of the boule, each of the sections 81 to 87 were individually sliced to thereby obtain 7 wafers of different nitrogen concentration for testing purposes. The results of the testing are shown in FIG. 4.

Figure 4:
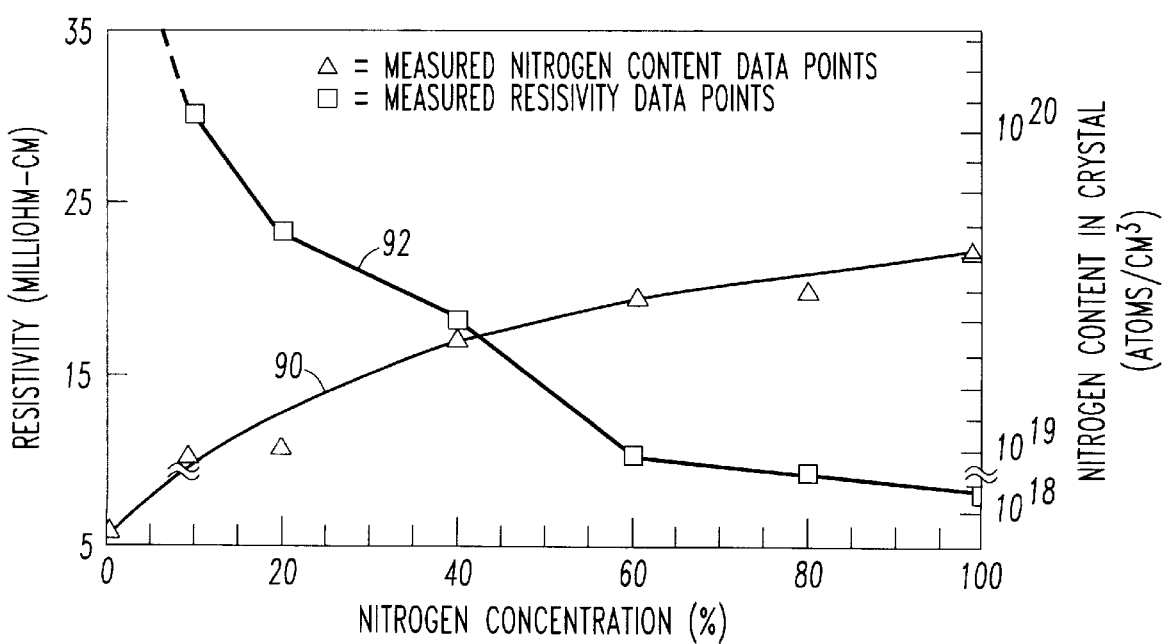
FIG. 4 are curves showing certain experimental results in achieving a low resistivity silicon carbide wafer in accordance with the present invention.

In FIG. 4 curve 90 represents measured nitrogen content of the grown crystal, in atoms per cubic centimeter, as a function of gaseous nitrogen concentration used in the growing process. Actual recorded data points for curve 90 are shown as triangles. Curve 92 represents measured resistivity of the cut wafer, in milliohm-centimeters, as a function of nitrogen concentration. Actual recorded data points for curve 92 are shown as squares. The nitrogen concentration for growing the 7 sections 81 to 87 of boule 80 (FIG. 3) are represented by the triangles associated with curve 90. That is, section 81 was grown with a substantially zero concentration of nitrogen, section 82 with a 10% concentration, section 83 with a 20% concentration, section 84 with a 40% concentration, section 85 with a 60% concentration, section 86 with an 80% concentration and section 87 with a 100% concentration. As can be seen, as the nitrogen content was increased the nitrogen content of the crystal increased and the resistivity progressively decreased, attaining a low value of approximately 7 milliohm-centimeters for 100% nitrogen concentration. The resistivity for zero nitrogen content was off scale at approximately 150 milliohm-centimeters.

Accordingly, there has been described a process for obtaining low resistivity silicon carbide boules which may be prepared for semiconductor substrate use. Although one example has been described, it is understood that various modifications may be made in light of the above teachings.

What is claimed is:

1. A method of making a low resistivity silicon carbide single crystal boule comprising the steps of:

(a) placing a silicon carbide seed crystal and a silicon carbide feedstock within a physical vapor transport furnace system;

(b) introducing nitrogen gas into said furnace system;

(c) maintaining the pressure within said furnace system at a substantially constant value between approximately 1 and 100 Torr;

(d) measuring the pressure within said furnace system during crystal growth;

(e) adding said nitrogen gas, as a function of said measured pressure, to maintain said constant value of pressure and a constant value of nitrogen partial pressure as said nitrogen gas is incorporated into said crystal; and (f) establishing, during said method a requisite heat pattern for physical vapor transport crystal growth.

2. A method according to claim 1 which includes the step of:

(a) maintaining said constant pressure at a value less than 50 Torr.

3. A method according to claim 2 which includes the step of:

(a) maintaining said constant pressure at a value of 20 Torr.

4. A method according to claim 1 which includes the step of:

(a) adding an inert gas along with said nitrogen gas to said furnace system.

5. A method according to claim 1 which includes the step of:

(a) controlling the addition of said nitrogen gas by means of a process controller which is connected to receive an indication of said pressure within said furnace system.

6. A method according to claim 1 which includes the steps of:

(a) initially reducing the pressure within said furnace system to a fraction of a Torr;

(b) heating said furnace to a predetermined temperature which will not sustain crystal growth;

(c) introducing at least said nitrogen gas into said furnace system to pressurize it to a value substantially higher than said constant value;

(d) increasing said temperature to a value to sustain crystal growth; and thereafter (e) reducing the pressure within said furnace system to said constant value.

7. A method according to claim 1 which includes the additional step of:

(a) slicing said boule to form a semiconductor substrate.

* * * * *